United States Patent [19]

Kaufman et al.

[11] Patent Number: 5,274,306
[45] Date of Patent: Dec. 28, 1993

[54] CAPACITIVELY COUPLED RADIOFREQUENCY PLASMA SOURCE

[75] Inventors: Harold R. Kaufman, Laporte; Raymond S. Robinson, Fort Collins, both of Colo.

[73] Assignee: Kaufman & Robinson, Inc., Fort Collins, Colo.

[21] Appl. No.: 919,400

[22] Filed: Jul. 29, 1992

Related U.S. Application Data

[63] Continuation of Ser. No. 826,671, Jan. 28, 1992, abandoned, which is a continuation of Ser. No. 576,796, Aug. 31, 1990, abandoned.

[51] Int. Cl.$^5$ ............................................. H05H 1/46
[52] U.S. Cl. ............................ 315/111.41; 315/111.21; 315/111.31; 313/231.31
[58] Field of Search ................... 315/111.21, 111.31, 315/111.41, 111.71, 111.81; 313/231.31

[56] References Cited

U.S. PATENT DOCUMENTS

| | | | |
|---|---|---|---|
| 3,156,090 | 11/1964 | Kaufman | 60/35.5 |
| 3,903,891 | 9/1975 | Brayshaw | 128/303.14 |
| 4,104,875 | 8/1978 | Birner et al. | 60/202 |
| 4,479,075 | 10/1984 | Elliot | 315/111.21 |
| 4,652,795 | 3/1987 | Lee et al. | 315/111.41 |
| 4,684,848 | 8/1987 | Kaufman et al. | 315/111.81 |
| 4,710,283 | 12/1987 | Singh et al. | 315/111.81 X |
| 4,716,340 | 12/1987 | Lee et al. | 315/111.31 X |
| 4,829,215 | 5/1989 | Kim et al. | 315/111.41 |
| 4,838,021 | 6/1989 | Beattie | 315/111.81 X |
| 4,906,900 | 3/1990 | Asmusson | 315/111.41 X |
| 4,911,814 | 3/1990 | Matsuoka et al. | 315/111.41 X |
| 4,977,352 | 12/1990 | Williamson | 315/111.41 X |

OTHER PUBLICATIONS

"Broad Beam Ion Sources", *Review of Scientific Instruments* vol. 61, pp. 230–235, Jan. 1990.
"Plasma Potentials of 13.56-MHz RF Argon Glow Discharges in a Planar System", *Journal of Applied Physics*, vol. 57, pp. 59–66, Jan. 1985.
"Analysis of Area-Ratio Effect for Radio-Frequency Diode," *J. of Vacuum Science and Technology A.*, vol. A6, pp. 2572–2573, Jul./Aug. 1988.
*Journal of Vacuum Science and Technology B*, vol. B6, pp. 284–287, Jan./Feb. 1988.

*Primary Examiner*—Steven Mottola
*Assistant Examiner*—Michael B. Shingleton
*Attorney, Agent, or Firm*—Hugh H. Drake

[57] ABSTRACT

A pair of dissimilarly-sized electrodes are driven by a radiofrequency source to create a plasma. A magnetic field is oriented to be parallel to a surface area on the smaller electrode. The field strength increases to either side of that smaller electrode. As shown, ions are electrostatically accelerated out of the plasma, but they instead may be accelerated magnetically, electrons may in the alternative be extracted or there may be no accelerating mechanism.

28 Claims, 3 Drawing Sheets

CAPACITIVELY COUPLED RADIOFREQUENCY PLASMA SOURCE

RELATED APPLICATIONS

The present application is a continuation of co-pending application Ser. No. 07/826,671 filed Jan. 28, 1929, now abandoned which in turn was a continuation of then co-pending application Ser. No. 07/576,796 filed Aug. 31, 1990 now abandoned.

This invention relates to plasma sources. More particularly, it pertains to a plasma source in which radiofrequency energy is capacitively coupled to a discharge process in order to generate a plasma having ions and electrons.

Broad-beam ion sources, in which grids with a plurality of apertures serve to electrostatically accelerate ions have been used for many years both for electric space propulsion and in industrial applications. A review of the history and technology was presented by H. R. Kaufman in "Broad-Beam Ion Sources", *Review of Scientific Instruments*, Vol. 61, pp. 230-235, January 1990. In these sources, the ion-generating discharges most often have been of the direct-current (dc) type. An electron-emitting cathode is a critical component for a dc discharge by reason of either adding complexity by requiring a special electron source such as a hollow cathode or by exhibiting only the limited lifetime typical of a hot filament.

Radiofrequency (RF) energy can be used to generate ions using either inductive or capacitive coupling to deliver the RF energy to the plasma. The use of an inductive coupling is illustrated in U.S. Pat. No. 3,903,891 issued Sep. 9, 1975 to Brayshaw. U.S. Pat. No. 4,479,075 issued Oct. 23, 1984 to Elliot describes the use of capacitive coupling as does an article by K. Kohler, J. W. Coburn, D. E. Horne, E. Kay and J. H. Keller, "Plasma Potentials of 13.56-MHz RF Argon Glow Discharges in a Planar System," *Journal of Applied Physics*, Vol. 57, pp. 59-66, January, 1985. The use of an RF discharge process thus offers a means of avoiding cathode limitations and problems. However, ion sources incorporating RF discharges have had other problems.

For example, an inductively coupled RF process has been utilized in an ion source by placing a dielectric window between the inductor and the discharge region as shown by Birner et al. in U.S. Pat. 4,104,875, issued Aug. 8, 1978. A dielectric window, however, is sensitive to conductive deposits that can easily result from sputtering. When a dielectric window becomes coated with such deposits, the RF energy can no longer reach the discharge region. Such sensitivity is undesirable in industrial applications where a variety of contaminates is encountered. If the dielectric window is omitted, on the other hand, the inductor is exposed directly to the plasma as a result of which cooling the inductor can become a problem. Because the discharge chamber is normally at an elevated potential, internal liquid cooling of such an inductor requires either voltage isolation or the operation of a cooling system at an elevated potential.

As indicated, capacitively-coupled RF discharge processes have also been used in ion sources. However, they require the development of a magnetic field in order to reach a normal operating pressure of less than one milliTorr (approximately less than 0.1 Pascal). Of background interest is an RF diode which uses a capacitively-coupled RF energy and in which a plasma is developed as discussed by H. R. Kaufman and S. M. Rossnagel in "Analysis of Area-Ratio Effect for Radio-Frequency Diode," *J. of Vacuum Science and Technology A*, Vol. A6, pp. 2572-2573, July/August 1988. The RF diode has been widely used, it is relatively well understood and it has some basic similarities to apparatus in accordance with the present invention. In contrast, however, it has no magnetic field, normally operates at twenty-thirty milliTorr and has a minimum peak-to-peak voltage between electrodes of about two-hundred volts.

In addition to exhibiting an excessively high pressure for serving as a broad-beam source of charged particles, the voltage level in the RF diode is sufficiently high to generate considerable internal sputtering that may result in contamination of a target which is etched, serves as a sputter source for disposition elsewhere or on which a film is being deposited and the particle beam results in property modification or enhancement compared to a film that is deposited without bombardment. Because of its degree of similarity, further discussion of the RF diode is set forth below.

Another capacitively coupled RF ion source was described by R. Lossy and J. Engemann, *Journal of Vacuum Science and Technology B*, Vol. B6, pp. 284-287, January/February 1988. In that source, the minimum operating voltage is similar to that in the conventional RF diode, that is, about two-hundred volts peak-to-peak. That level of voltage appears to be present both because the average ion energy is about one-hundred electron volts greater than might be expected as the result of the acceleration voltage and because of an applied voltage which is about five-hundred-and-twenty volts at a power level of five-hundred watts. Such a high plasma-electrode voltage is undesirable because of the likelihood of a large amount of electrode sputtering and, hence, target contamination. Nevertheless, that particular device is also of interest in the sense of providing background understanding before proceeding to consideration of the present invention. Accordingly, further discussion is included below with respect to such a device.

A general object of the present invention is to provide a new and improved radiofrequency-energy-driven plasma source.

Another object of the present invention is to provide a novel plasma source which avoids the disadvantages and undesirable features of such prior plasma sources as those hereinbefore discussed.

A further object of the present invention is to provide a novel plasma source which produces charged particles that may be accelerated in more than one way as for example but without limitation electrostatically through the use of apertured grids, electromagnetically as happens in an end-Hall ion source, or otherwise.

Yet another object of the present invention is to provide a novel plasma source which produces low-energy changed particles that may be used for ion-beam nuetralization (electrons) or low-energy bombardment of a surface (ions).

A still further object of the present invention is to provide a novel RF plasma source useful in both space propulsion and in connection with industrial applications.

A more specific object of the present invention is to provide a new plasma source which involves an improved manner of enhancing energy transfer from an RF electrode surface to a low pressure plasma.

Still another object of the present invention is to provide a new and improved plasma source in which energetic electrons are contained as a part of the operative combination.

Yet another object of the present invention is to provide a novel RF driven plasma source with an arrangement that reduces the plasma sheath voltages to a low level in order to reduce sputtering.

One more detailed object of the present invention is to provide a novel RF-driven plasma source wherein reduced target contamination is obtained by arrangement of the source so that an RF-driven electrode is removed from direct view of the target.

In accordance with the present invention, a plasma source is operative within an evacuated environment into which an ionizable gas is introduced. A first electrode is spaced from a plasma discharge region within the source. There also is a second electrode which has a surface area facing the discharge region. Coupled between the first and second electrodes is a radiofrequency source to deliver energy in creation of a plasma discharge process within the region. A field producer develops a magnetic field oriented in a direction substantially parallel to the electrode surface area in enhancement of the transfer of the energy to the plasma. To further enhance the ionization process the second electrode surface area is of a size significantly smaller than the size of the surface area of the first electrode.

The features of the present invention which are believed to be patentable are set forth with particularity in the appended claims. The organization and manner of operation of one specific embodiment of the invention, together with further objects and advantages thereof, may best be understood by reference to the following description taken in connection with the accompanying drawings in the several figures of which like reference numerals identify like elements and in which:

Figure 1:
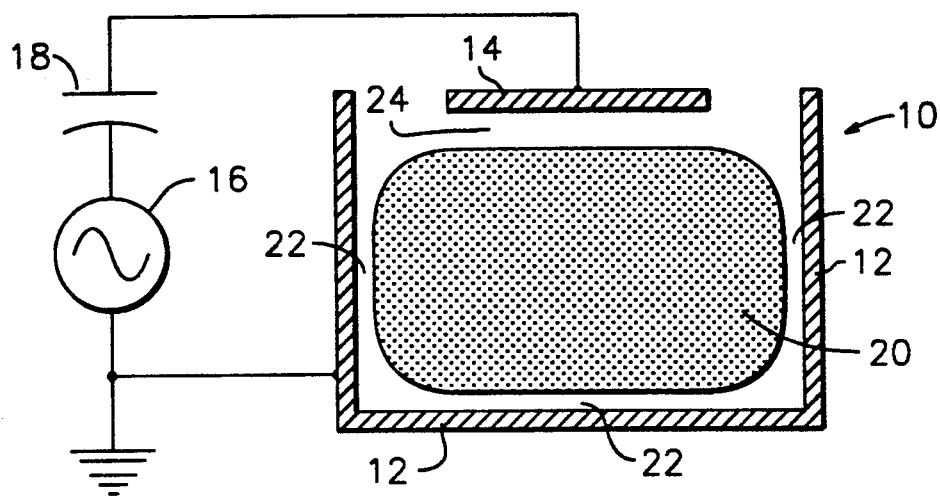
FIG. 1 is a schematic diagram of a prior-art RF diode.
Figure 2:
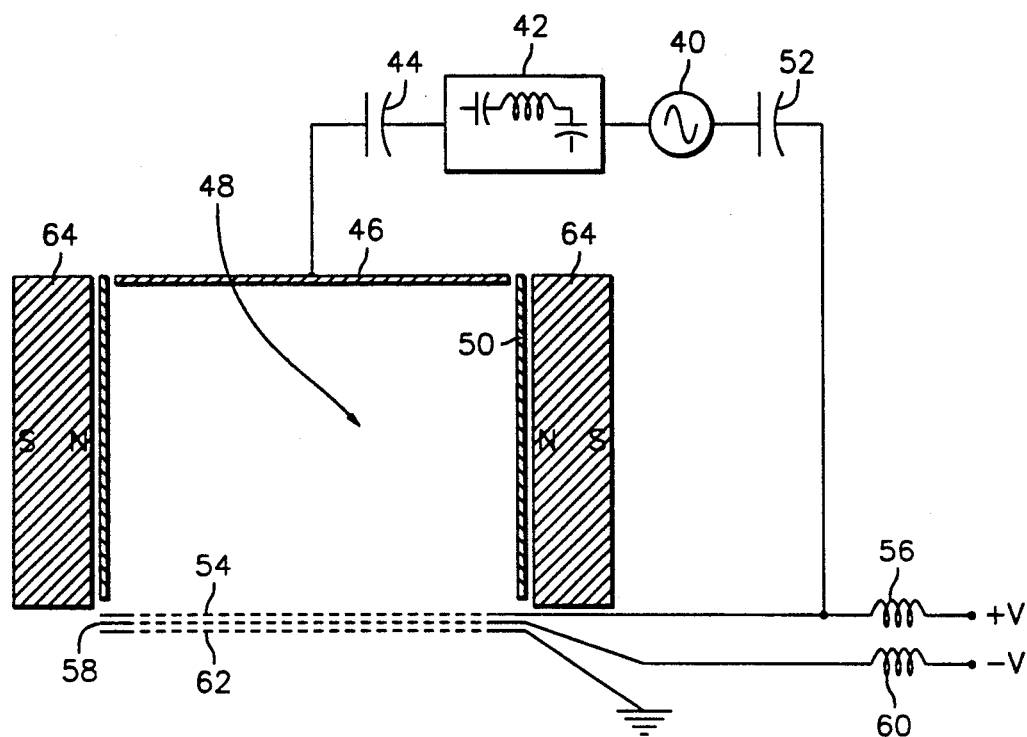
FIG. 2 is a schematic representation of a prior art RF-driven plasma source.
Figure 3:
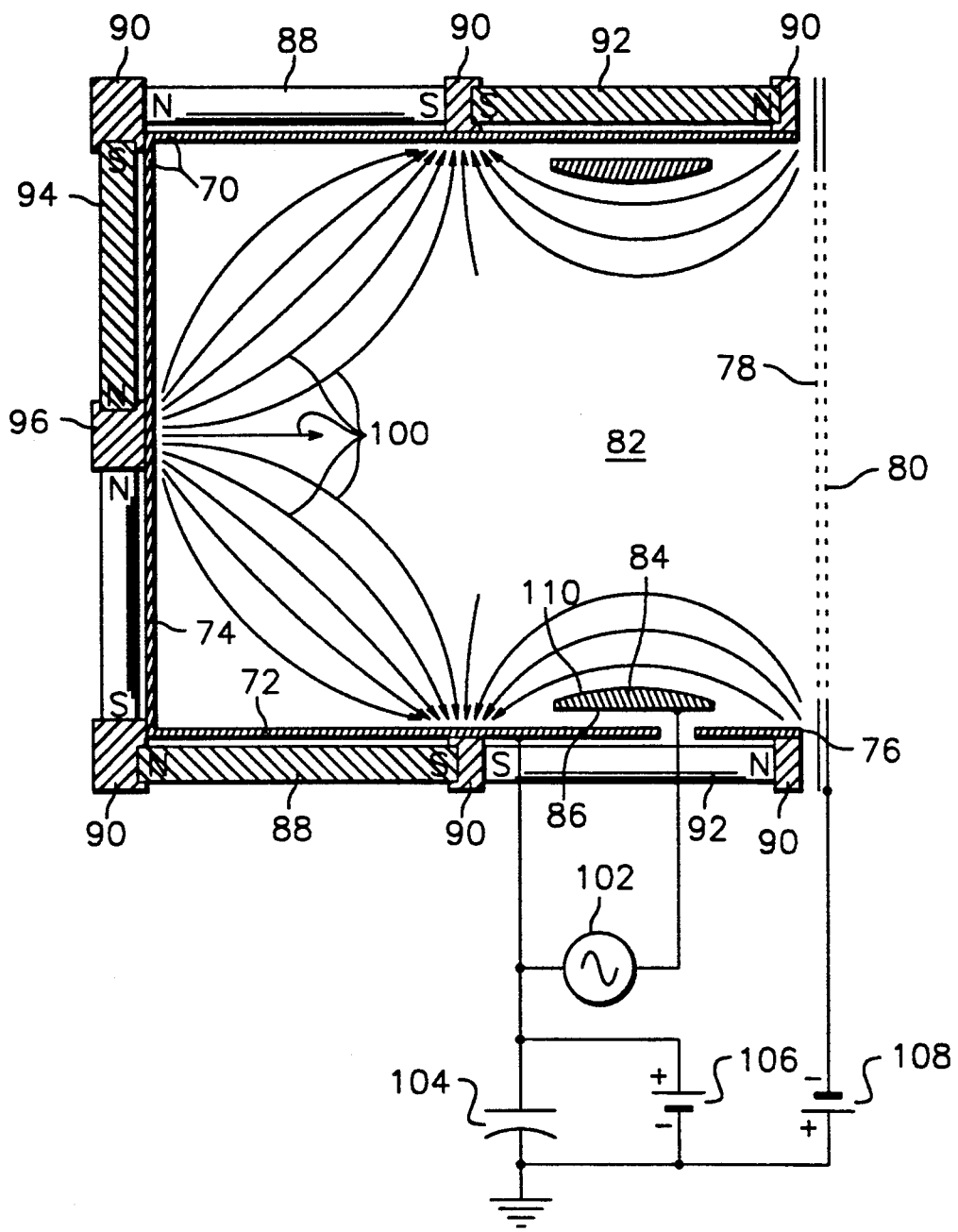
FIG. 3 is schematic diagram, including in part a representation similar to a longitudinal cross-section, of a radiofrequency plasma source in accordance with the present invention.

Although not specifically shown herein for the apparatus of FIGS. 1, 2 or 3, it is conventional and well understood that such plasma sources operate within an enclosure that is evacuated by drawing a vacuum therein as well as that a gas or vapor to be ionized is introduced within the region in which the discharge process takes place to generate the plasma.

In FIG. 1, a typical RF diode 10 represents a capacitively-coupled RF plasma source such as disclosed in the aforementioned Kohler et al. reference. The diode elements are a grounded electrode 12 having a cup shape and a driven or excitation-electrode 14 having the shape of a flat disc mounted in the open side of electrode 12. A radiofrequency source or supply 16 is coupled across electrodes 12 and 14 through a dc-isolating capacitor 18.

In operation of diode 10, a plasma 20 is produced within the inner region bounded by electrodes 12 and 14. Plasma 20 is separated from the wall of larger electrode 12 by a plasma sheath 22 as well as being separated from smaller electrode 14 by a plasma sheath 24.

Figure 1A:
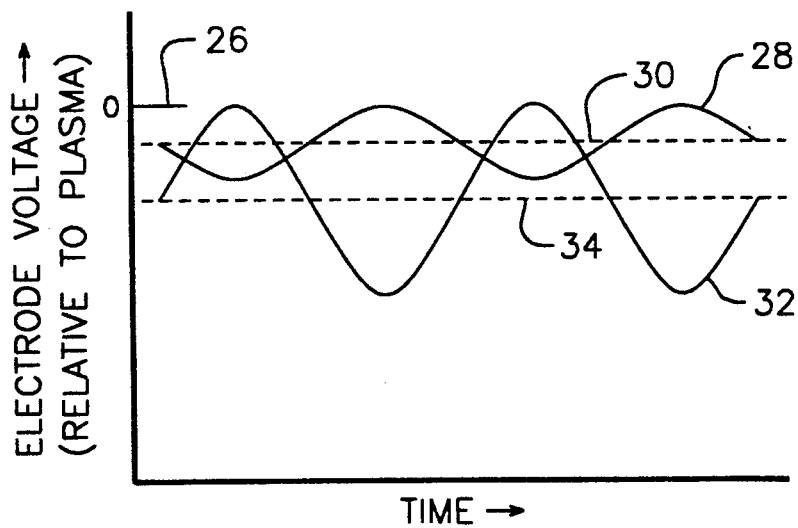
FIG. 1a is a graph containing waveforms useful for explaining the operation of the diode of FIG. 1.

In FIG. 1a, time is plotted along the abcissa and electrode voltage (relative to the plasma) is plotted along the ordinate. The potential of the discharge plasma is indicated to be zero at voltage level 26. The potential 28 of grounded electrode 12 is observed to follow an approximately sinusoidal variation with time, with the average potential 30 of electrode 12 being negative relative to plasma potential 26. Consequently, the peak value of potential 28 is approximately equal to plasma potential 26.

At the same time, the potential 32 on excitation electrode 14 also follows an approximately sinusoidal variation with time but its waveform is displaced one-hundred and eighty degrees from the potential waveform of electrode 12. The average potential value 34 is also negative relative to plasma potential 26 so that the peak value of potential 32 also is approximately equal to plasma potential 26.

That the peak potential for each electrode is approximately equal to that of the plasma is a result of the high mobility of electrons relative to that of ions. The net current to each electrode must equal zero, and a very short period of electron conduction during each RF cycle is sufficient to supply a number of electrons equal to the number of ions that arrive at those electrodes during the rest of the cycle.

The impedences of sheaths 22 and 24 are essentially capacitive which results in an inverse relationship between electrode areas and the amplitudes of the RF potential variations on those electrodes. Were the two electrodes 12 and 14 to have the same area exposed to the plasma, the potential variations of the two electrodes should be about equal. For the structure shown in FIG. 1 wherein grounded electrode 12 has more area in contact with the plasma, the potential variation is greatest at the small electrode as indicated in FIG. 1a. The exponent of that inverse variation as between potential variation and electrode areas depends on the relationship between the average potential difference across a plasma sheath and the ion arrival rate at that sheath. A more detailed explanation of that relationship may be had by reference to H. R. Kaufman and S. M. Rossnagel, "Analysis of Area-Ratio Effect for Radio-Frequency Diode," *J. of Vacuum Science and Technology A*, Vol. A6, pp. 2572–2573, July/August 1988.

For comparison to that which follows, it is significant to note that such an RF diode operates with no magnetic field. As mentioned in the introduction, it normally operates at twenty-thirty milliTorr and has a minimum peak-to-peak voltage between electrodes of about two-hundred volts. In addition to an excessively high pressure for use in a broad-beam charged-particle source, such a voltage level is high enough to generate considerable internal sputtering with the result of contamination of any target impinged upon by the charged-particle beam.

Figure 2A:
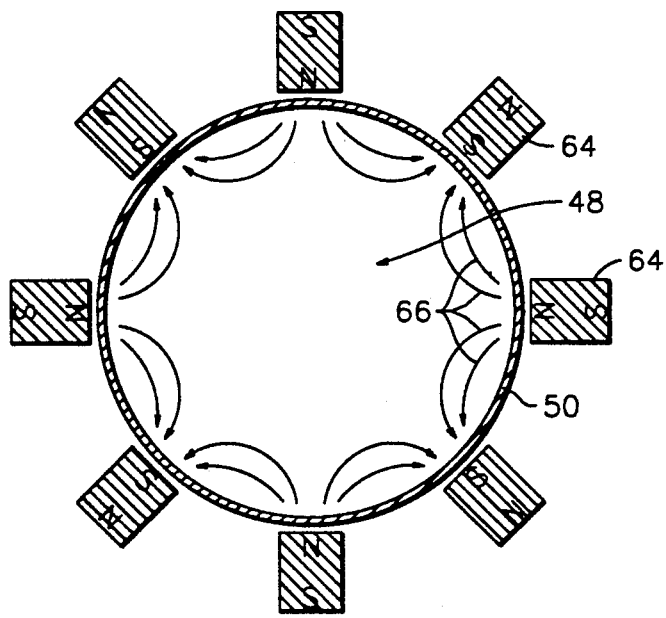
FIG. 2a is a schematic representation of the source in FIG. 2 showing basically only the arrangement of a plurality of magnets and the resultant magnetic field.

Turning now to FIGS. 2 and 2a, a radiofrequency power source or supply 40 is coupled through a tuning network 42 and capacitor 44 to a driven electrode 46 disposed at one open end of a discharge process chamber 48 enclosed by a cylindrical side wall 50. The other side of source 40 is coupled through a capacitor 52 to a screen grid 54 spanning the otherwise open end of chamber 48. Screen grid 54 is coupled through an isolating radiofrequency choke 56 to a positive potential source the magnitude of which determines the energy of the accelerated ions. In the usual manner of gridded ion sources, spaced outwardly beyond screen grid 54 is an accelerator grid 58 supplied from its negative source through a choke 60. Still further beyond grid 58 is a grounded grid 62 which serves to control beam divergence. For further discussion of the operation of grids 54 and 58 to obtain ion extraction from the plasma, cross reference may be had to U.S. Pat. No. 3,156,090-Kaufman, issued Sep. 18, 1961.

Circumferentially-spaced around chamber 48 are a plurality of permanent magnets 64 radially polarized alternatively in succession. Using the approach of the capacitively-coupled RF ion source of FIG. 2, the magnetic field 66 serves primarily to confine the generated plasma within a largely field-free region. That is, the magnetic field is not directly involved in the plasma generation process. The radiofrequency energy is applied between the two electrodes respectively at opposite ends of the chamber, and the magnetic field is generally around the outside where it serves to reduce radial outflow of the plasma. By reason of the low mass of the electrons in the plasma and the low value of magnetic field strength, the magnetic field acts primarily on the electrons and only indirectly through the electric fields on the ions.

Because there are essentially no magnetic fields between the plasma and the radiofrequency electrodes, the minimum operating voltage is similar to that of a conventional RF diode which as mentioned previously is a minimum of about two-hundred volts peak-to-peak. As noted in the introduction, that level of voltage appears to be present for a first reason that the average ion energy is about one-hundred electron volts greater than might be expected from the level of the accelerating voltage and secondly because of the applied voltage of five-hundred-and-twenty volts at a power level of five-hundred watts.

With the prior art background thus far described serving as a basis for comparison, attention is now directed to FIG. 3 for discussion of one specific embodiment of the present invention. In FIG. 3, a large electrode 70 has a side wall 72 which continues into end wall 74 but is open at its other end 76. Spanning open end 76 is a screen grid 78 followed by a parallel accelerator grid 80. Spaced within the interior region 82 from end 76 is a ring-shaped smaller electrode 84 having an outer surface 86 placed closely adjacent to inner wall 72 of electrode 70.

Circumferentially-spaced around the exterior surface of wall 72 of the approximately rear half of wall 72, away from open end 76, are a series of permanent magnets 88 held between pole pieces 90 as to resemble that which sometimes in the electrical field is called a squirrel cage. Circumferentially-spaced around the remaining portion of wall 72, toward open end 76, is another like series of permanent magnets 92 again held between magnetically permeable pole pieces 90 at respective ends. Alongside and outside of end wall 74 of electrode 70 are once again a circumferentially-spaced plurality of permanent magnets 94 but this time held by pole pieces 90 and a central permeable pole piece 96 in the manner that magnets 94 resemble the spokes of a wheel. All of pole pieces 90 are essentially the same, although as indicated by the drawings different ones are slightly modified so as to appropriately receive the different magnets located at different places around the assembly.

As indicated in FIG. 3, the magnet arrangement develops a static undirectional magnetic field having the shape shown by the representative arrows 100. In this instance, that field configuration may be assumed to be axially symmetric although axial symmetry is not as such a requirement for proper operation.

An RF power source or supply 102 is coupled directly between ring electrode 84 and larger surrounding electrode 70. Electrode 70 is returned to ground through a capacitor 104. Ring electrode 84 may be referred to as the driven or excitation electrode and it as well as RF grounded electrode 70 are at the same average dc potential so that the potential variation on electrode 84 is approximately symmetrical about the potential on electrode 70.

Electrode 70 has a rough similarity in function to grounded electrode 12 of the RF diode in FIG. 1. Similarly, RF electrode 84 has a function which is roughly similar to that of excitation electrode 14 in the diode of FIG. 1. Note, however, that the plasma source of FIG. 3 does not include the equivalent of capacitor 18 in the FIG. 1 device to there provide dc isolation. This is because it has been found that the inclusion of such a capacitor in the FIG. 3 system results in decreased ion generation efficiency.

The ion energy available for acceleration in the plasma source of FIG. 3 is determined by the positive potential of dc power source 106. Ions produced within plasma region 82 are accelerated through apertures in screen grid 78, which is electrically isolated from the other electrodes, and accelerator grid 80 which is maintained at a negative potential relative to ground by dc power supply 108. The negative potential on accelerator grid 80 prevents the back flow of electrons from the ion beam (electron backstreaming). As is usual and conventional with sources of this kind, the accelerated ion beam must be neutralized with the addition of electrons as typically supplied from a separate neutralizer filament which is not shown but is described more fully in the aforementioned Kaufman U.S. Pat. No. 3,156,090.

Also not shown as indicated above is the surrounding vacuum chamber which is understood to be necessary for operation. That vacuum chamber is also assumed to be held to ground potential. During operation, a plasma consisting of electrons and ions is generated in region 82 as a result of energy delivered from RF source 102. The strength of magnetic field 100 and the energy and mean path length for the electrons developed are such that the conductivity of the plasma parallel to the magnetic field is much greater than the conductivity transverse to that magnetic field. This is in accordance with the strong-field approximation of plasma physics. The ions that reach the ion optics of screen grid 78 and accelerator grid 80 are accelerated to form an energetic ion beam which, as indicated in the introduction and throughout the ion source prior art, can be used in a variety of propulsive and industrial applications.

There are several important contributions as a result of the arrangement and operation of the source of FIG. 3. First of all, the magnetic field strength is significant near RF excitation electrode 84. Moreover, the interior surface 110 that faces plasma region 82 is shaped and formed to be approximately parallel to the direction of the magnetic field. In this case where the field configuration is as shown, surface 110 is given a convex shape from the inner to the outer sides of ring 84. Further-more, the portion of magnetic field 100 near electrode 84 is configured so that the field strength is given a broad minimum near electrode 84, a field strength which increases in both directions (to the left and right in FIG. 3) away from electrode 84.

Such a configuration of the magnetic field has been found to be very effective in generating ions at a low pressure of neutral molecules and while operating with low electrode voltages. The plasma sheaths adjacent to electrodes 70 and 84 constitute a capacitive load upon RF source 102 while at the same time there is a resistivity present as a result of electron collisions within the plasma that fills interior region 82 and which causes the dissipation of RF energy as the atoms are ionized. The sheaths and plasma are omitted from FIG. 3 to show the magnetic field, but they have a rough similarity to sheaths 22 and 24 and plasma 20 in FIG. 1. During operation, a low plasma conductivity results in the direction transverse to the magnetic field by reason of the presence of substantial $I^2R$ heating of the electrons in the vicinity of smaller RF electrode 84. This results in the efficient generation of electron-ion pairs. This generation contrasts with the source of FIG. 2 where there is no magnetic field near most of the surface of the RF excitation electrode as a result of which it is difficult to develop the $I^2R$ heating required for ionization at the low operating pressures of most interest. This generation also contrasts with the generation in other possible magnetic field configurations in which the magnetic field is normal to portions of the RF excitation electrode and as a result of which it is also difficult to develop the required $I^2R$ heating.

The parallelism between excitation electrode surface 110 and the direction of magnetic field 100 serves to minimize the sheath voltage between electrode 84 and the plasma developed in region 82. Were that surface and the field direction not parallel, much higher RF currents would be required to generate the same plasma density, with those higher currents serving to generate higher sheath voltages. In this manner, most of the RF power would be dissipated near the portion of electrode 84 that penetrates deepest into the magnetic field inasmuch as electrical contact with other portions of the adjacent plasma would then be established by a much higher than optimum conductivity parallel to the magnetic field.

Another important factor in the localization of the RF heating is the containment by the magnetic field of the secondary electrons from ion collisions with the RF excitation electrode. In a conventional RF diode, those electrons add to the electron energy throughout the plasma so as to avoid a localized effect. Although a magnetic field parallel to RF excitation electrode 84 greatly improves the RF heating efficiency, it also contains the secondary electrons and thus serves to localize the energy input when a large sheath voltage is also present.

As mentioned above, there is an increase of magnetic field strength in both directions laterally away from RF electrode 84. By a mirror effect, this variation in magnetic field strength serves to contain the energetic electrons that result from the $I^2R$ heating and that increases the ionization efficiency. Without this variation in field strength, particularly in a direction toward electrode 70, the energetic electrons would tend to escape to electrode 70, and thereby be lost to the ionization process.

Adding most of the RF energy into RF electrode 84 results in the development of a sheath that is larger than the sheath voltage at electrode 70, in a manner which is roughly similar to the area-ratio effect of the conventional RF diode as described in the aforementioned Kaufman and Rossnagel article. Because electrode 84 is located at the side of region 82, any sputter contamination from electrode 84 is unlikely to escape through screen grid 78 and accelerator grid 80 to the target of the ion beam. The likelihood of escape for sputtered material from electrode 84 can be further reduced by reducing the diameter of the portions of grids 78 and 80 with apertures, in effect hiding RF electrode 84 behind unapertured portions screen grid 78.

As an example of one form of successfully operated ion source which had substantially the configuration shown in FIG. 3, the discharge chamber was sixteen centimeters in diameter. The magnetic field strength immediately above electrode 84 was about 0.01 Tesla (100 Gauss), and the neutral pressure in the plasma region (using either argon or oxygen) was less than one milliTorr (less than 0.1 Pascal). Under those conditions and using 500 watts of RF energy at 13.56 MHz, a 200 mA beam of ions was extracted. The operating voltages on RF electrode 84 were within ±50 volts of the voltage on electrode 70 with the result of minimal sputtering of electrode 84. Screen grid 78 assumed a potential of ten-twenty volts negative of electrode 70 so as again to result in little sputtering.

FIG. 3 specifically illustrates and has been described with respect to the use of grids so as to achieve electrostatic acceleration of the ions. Nevertheless, the ionization plasma process effected by the apparatus of FIG. 3 may instead be used in apparatus where the acceleration is achieved by electromagnetic action as is the acceleration mechanism, for example, in U.S. Pat. No. 4,862,032, issued Aug. 29, 1989, which discloses and claims an end-Hall ion source. On the other hand, the present approach may be incorporated into other devices using grids as known in the art to include one, two or three such grids.

As disclosed and claimed in U.S. Pat. No. 4,684,848 issued Aug. 4, 1987, an apparatus which in the overall is very similar to the apparatus in FIG. 3, in that it also uses an electrostatic grid for acceleration, is employed to produce a broad electron beam instead of an ion beam. Analogously, arranging the apparatus of FIG. 3 so as to operate in accordance with that patent enables the approach of the present invention to be used for the extraction instead of electrons from the plasma while obtaining all of the advantages herein described for efficient plasma generation with low electrode voltages and at low background pressure of neutral molecules. Similarly, such an electron extraction arrangement also could be used as a neutralizer for an ion source.

In another manner, the ion optics (screen grid 78 and accelerator grid 80) may be omitted to allow ion energy ions and electrons to escape and directly provide low-energy ion bombardment or the electron neutralization of an ion beam. In the latter case, the loss of neutral gas from region 82 could be reduced by replacing screen grid 78 with a flat plate having a single central aperture, with that plate either electrically isolated or connected to electrode 70.

A second feature of the present invention, useful in itself to enhance energy transfer to a low-pressure plasma, is the combination of magnetic structure and electrode orientation so as in a plasma device to cause the magnetic field to be substantially parallel to the surface of the RF electrode. Adding, then, the additional contribution of magnetic field orientation so as to produce a field strength variation that tends to contain the energetic electrons affords in itself a different important increase in plasma generation efficiency.

Another important contribution from the arrangement shown in and discussed with respect to FIG. 3 pertains to orientation of the contact area between the excitation electrode and the discharge plasma in a manner that is sufficient to reduce sheath voltages to a low level as is required to reduce sputtering within an ion source. Still another feature in connection with the effort to prevent contamination of a target is contributed by locating the higher-potential excitation electrode 84 very near wall 72 of electrode 70 and thereby off to one side from the apertures in grids 78 and 80. That precludes excitation electrode 84 from having a direct view of the target (not shown) through the ion optics. With the highest potential on smaller electrode 84, it in effect is rendered more active in the process of producing the plasma. It should be noted that outside surface 86 of excitation electrode 84 is spaced sufficiently close to wall 72 of electrode 70 that no plasma is created in the space therebetween.

While a particular embodiment of the invention has been shown and described, and various alternative versions and modifications have been taught, it will be obvious to those skilled in the art that changes and modifications may be made without departing from the invention in its broader aspects. Therefore, the aim in the appended claims is to cover all such changes and modifications as fall within the true spirit and scope of that which is patentable.

We claim:

1. A plasma source operative within an evacuated environment into which an ionizable gas is introduced, comprising:
   a first electrode having a surface area of predetermined size facing generally toward a plasma discharge region within said source;
   a second electrode having a surface area facing toward said region and of a size significantly smaller than said predetermined size;
   a field producer which develops a static unidirectional magnetic field oriented in a direction generally parallel to said surface area of said second electrode as seen thereby with the strength of said magnetic field increasing in each direction of said field laterally away from said second electrode;
   and a source of radiofrequency energy coupled between said first and second electrodes to deliver energy in creation of a plasma discharge process within said region.

2. A plasma source as defined in claim 1 in which said magnetic field curves over said surface of said second electrode and in which said surface area of said second electrode has a curvature substantially the same as that of said field.

3. A plasma source as defined in claim 1 in which said first electrode has the shape of a cylinder closed at one end and open at its other end through which charged particles are extracted from said plasma.

4. A plasma source operative within an evacuated environment into which an ionizable gas is introduced, comprising:
   a first electrode having a surface area of predetermined size facing generally toward a plasma discharge region within said source;
   a second electrode having a surface area facing toward said region and of a size significantly smaller than said predetermined size, said second electrode being in the shape of an annular ring and said first electrode including a cylindrical wall axially surrounding said second electrode;
   a field producer which develops a static unidirectional magnetic field oriented in a direction generally parallel to said surface area of said second electrode as seen thereby with the strength of said magnetic field laterally increasing in each direction of said field away from said second electrode;
   and a source of radiofrequency energy coupled between said first and second electrodes to deliver energy in creation of a plasma discharge process within said region.

5. A plasma source as defined in claim 4 in which said second electrode is spaced inside said first electrode by a distance insufficient to enable entry of said plasma therebetween.

6. A plasma source as defined in claim 4 in which said field producer includes a plurality of permanent magnets individually spaced in succession circumferentially around said first electrode.

7. A plasma source as defined in claim 6 in which said first electrode has an end wall enclosing one end of said cylindrical wall and in which said field producer also includes a plurality of permanent magnets individually spaced in radial succession circumferentially over said end wall.

8. A plasma source as defined in claim 4 in which the strength of said magnetic field and the energy and mean path length for electrons in said plasma establish a plasma conductivity parallel to said magnetic field that is substantially greater than the plasma conductivity in a direction transverse to said magnetic field.

9. A plasma source as defined in claim 4 in which the strength of said magnetic field increases in the direction from said discharge region to said second electrode.

10. A plasma source as defined in claim 4 which further includes an accelerator for effecting the extraction of charged particles from said plasma.

11. A plasma source as defined in claim 10 in which said particles are extracted by said accelerator to move along a path in a given direction from said region and in which said second electrode is located laterally to one side of said path.

12. A plasma source operative within an evacuated environment into which an ionizable gas is introduced, comprising:
   an essentially non-emissive first electrode spaced from a plasma discharge region within said source;
   an essentially non-emissive second electrode having a surface area facing said region;
   a source of radiofrequency energy coupled between said first and second electrodes to deliver energy in creation of a plasma discharge process within said region;
   and a field producer which develops a static unidirectional magnetic field oriented in a direction substantially parallel to said surface area as seen thereby in enhancement of the transfer of said energy to said plasma, the contact area between said second electrode and said plasma discharge region as oriented being sufficient to minimize sheath voltage at the boundry of said plasma.

13. A plasma source as defined in claim 12 in which said field exhibits a variation in strength with respect to said second electrode in a direction which contains energetic electrons.

14. A plasma source operative within an evacuated environment into which an ionizable gas is introduced, comprising:
   first electrode having a surface area facing a plasma discharge region within said source;
   an essentially non-emissive second electrode also having a surface area facing toward said region;
   a field producer which develops a static unidirectional magnetic field oriented in a direction generally parallel to said surface area of said second electrode as seen thereby;
   a source of radiofrequency energy coupled between said first and second electrodes to deliver energy in creation of a plasma discharge process within said region, the contact area between said electrodes and said plasma discharge region as oriented being sufficient to minimize sheath voltage at the boundry of said plasma;
   and an apertured electrode for the efflux of charged particles from said plasma.

15. A plasma source as defined in claim 14 in which said apertured electrode is biased to extract one of electrons and ions from said plasma.

16. A plasma source as defined in claim 14 in which said field is configured with respect to said electrodes so as to contain energetic electrons.

17. A plasma source as defined in claim 14 in which the strength of said magnetic field and the energy and mean path length for electrons in said plasma establish a plasma conductiveity parallel to said magnetic field that is substantially greater than the plasma conductivity in a direction transverse to said magnetic field.

18. A plasma source operative within an evacuated environment into which an ionizable gas is introduced, comprising:
   an essentially non-emissive first electrode having a surface area of predetermined size facing generally toward a plasma discharge region within said source;
   an essentially non-emissive second electrode also having a surface area facing toward said region and of a size significantly smaller than the predetermined size;
   a field producer which develops a static unidirectional magnetic field oriented in a direction generally parallel to said surface area of said second electrode as seen thereby;
   a source of radiofrequency energy coupled between said first and second electrodes to deliver energy in creation of a plasma discharge process within said region, the contact area between said second electrode and said plasma discharge region as oriented being sufficient to minimize sheath voltage at the boundry of said plasma;
   and an apertured electrode for the efflux of charged particles from said plasma.

19. A plasma source as defined in claim 18 in which said apertured electrode is biased to extract one of electrons and ions from said plasma.

20. A plasma source as defined in claim 19 in which said field producer includes a plurality of permanent magnets individually spaced in succession circumferentially around a cylindrical wall of said first electrode.

21. A plasma source as defined in claim 20 in which said first electrode has an end wall enclosing one end of said cylindrical wall and in which said field producer also includes a plurality of permanent magnets individually spaced in radial succession circumferentially over said end wall.

22. A plasma source as defined in claim 19 in which said particles are extracted by said biased electrode to move along a path in a given direction from said region and in which said second electrode is aligned laterally and to one side of said path.

23. A plasma source as defined in claim 18 in which the strength of said magnetic field increases in each direction of said field away from said electrodes.

24. A plasma source as defined in claim 18 in which said magnetic field curves over said surface of said second electrode and in which said surface area of said second electrode has a curvature substantially the same as that of said field.

25. A plasma source as defined in claim 18 in which said first electrode has the shape of a cylinder closed at one end and open at its other end through which charged particles are extracted from said plasma.

26. A plasma source as defined in claim 18 in which said second electrode is in the shape of an annular ring and said first electrode includes a cylindrical wall axially surrounding said second electrode and in which said second electrode is spaced inside said first electrode by a distance insufficient to enable entry of said plasma therebetween.

27. A plasma source operative within an evacuated environment into which an ionizable gas is introduced, comprising:
   an essentially non-emissive first electrode having a surface area of predetermined size facing generally toward a plasma discharge region within said source;
   an essentially non-emissive second electrode also having a surface area facing toward said region and of a size significantly smaller than the predetermined size;
   a field producer which develops a static unidirectional magnetic field oriented in a direction generally parallel to said surface area of said second electrode as seen thereby;
   a source of radiofrequency energy coupled between said first and second electrodes to deliver energy in creation of a plasma discharge process within said region the strength of said magnetic field and the energy and mean path length for electrons in said plasma establishing a plasma conductivity parallel to said magnetic field that is substantially greater than the plasma conductivity in a direction transverse to said magnetic field;
   and an apertured electrode for the efflux of charged particles from said plasma.

28. A plasma source operative within an evacuated environment into which an ionizable gas is introduced, comprising:
   a first electrode having a surface area of predetermined size facing generally toward a plasma discharge region within said source;
   a second electrode also having a surface area facing toward said region and of a size significantly smaller than the predetermined size;

a field producer which develops a static unidirectional magnetic field oriented in a direction generally parallel to said surface area of said second electrode as seen thereby, the strength of said magnetic field increasing in the direction from said discharge region said second electrode;

a source of radiofrequency energy coupled between said first and second electrodes to deliver energy in creation of a plasma discharge process within said region;

and an apertured electrode for the efflux of charged particles from said plasma.

* * * * *

UNITED STATES PATENT AND TRADEMARK OFFICE
CERTIFICATE OF CORRECTION

PATENT NO. : 5,274,306
DATED : December 28, 1993
INVENTOR(S) : Harold R. Kaufman, et. al.

It is certified that error appears in the above-indentified patent and that said Letters Patent is hereby corrected as shown below:

On the Title page, col. 2, line 11, under item [56] References Cited:
OTHER PUBLICATIONS
Add as an additional entry:

"RF Ion source, *IBM Technical Disclosure Bulletin,* Vol. 24, No. 11b, April 1982, pp. 5833-5835.

Column 1, lines 6-10 should read -- The present application is a continuation of co-pending application Ser. No. 07/826,671 filed Jan. 28, 1992, now abandoned, which in turn was a continuation of then co-pending application Ser. No. 07/576,796 filed Aug. 31, 1990, now abandoned.

Column 1, line 17: after "ions" a comma (,) should be inserted.

Column 2, line 60: "changed" should read -- charged --.

Column 8, line 57: "ion" should read -- low --.

Column 11, line 10: before "first" there should be inserted -- an essentially non-emissive --.

UNITED STATES PATENT AND TRADEMARK OFFICE
CERTIFICATE OF CORRECTION

PATENT NO. : 5,274,306
DATED : December 28, 1993
INVENTOR(S) : Harold R. Kaufman, et. al.

It is certified that error appears in the above-indentified patent and that said Letters Patent is hereby corrected as shown below:

Column 12, line 52: after "region", a comma (,) should be inserted.

Column 13, line 6: after "region", insert -- to --.

Signed and Sealed this

Seventh Day of June, 1994

*Attest:*

BRUCE LEHMAN

*Attesting Officer*     *Commissioner of Patents and Trademarks*